US005528073A

United States Patent [19]
Gilmore

[11] Patent Number: 5,528,073
[45] Date of Patent: Jun. 18, 1996

[54] BUS BAR HAVING REDUCED PARASITIC INDUCTANCES AND EQUAL CURRENT PATH LENGTHS

[75] Inventor: Thomas Gilmore, Wauwatosa, Wis.

[73] Assignee: Allen-Bradley Company, Inc., Milwaukee, Wis.

[21] Appl. No.: 270,340

[22] Filed: Jul. 5, 1994

[51] Int. Cl.$^6$ ............................. H01L 25/07; H01L 23/52
[52] U.S. Cl. .................... 257/584; 257/691; 257/700; 257/724
[58] Field of Search ..................................... 257/690, 691, 257/532, 688, 689, 700, 723, 724, 712, 584, 587

[56] References Cited

U.S. PATENT DOCUMENTS

| | | | |
|---|---|---|---|
| 4,907,068 | 3/1990 | Amann et al. | 257/724 |
| 5,347,158 | 9/1994 | Matsuda et al. | 257/691 |

*Primary Examiner*—Peter Toby Brown
*Attorney, Agent, or Firm*—John M. Miller; John J. Horn; George A. Montanye

[57] ABSTRACT

A bus bar having reduced parasitic inductance and equal current path legends. A bus bar of the present invention has a first plate connected to a collector of a first transistor, a collector of a second transistor, an emitter of a third transistor and an emitter of a fourth transistor; a second plate including a second plate input connected to a collector of the third transistor and a collector of the fourth transistor; a third plate including a third plate input connected to an emitter of the first transistor and an emitter of the second transistor; and a fourth plate which is connected to the first plate. The first plate, the second plate, and the third plate are disposed such that the lengths of the current paths from the fourth plate through the first transistor to the input of the third plate is equal to the length of the current path from the fourth plate through the second transistor to the input of the third plate. Similarly, the current path from the fourth plate through the third transistor to the input of the second plate is equal to the length of the current path from the fourth plate through the fourth transistor to the input of the second plate. A bus bar of the present invention has many advantages including reduced parasitic inductances, equal current path lengths, ease of construction, the ability to keep parallel transistor operating temperatures equal, and the inputs and output being located on the same side of the bus bar.

12 Claims, 7 Drawing Sheets

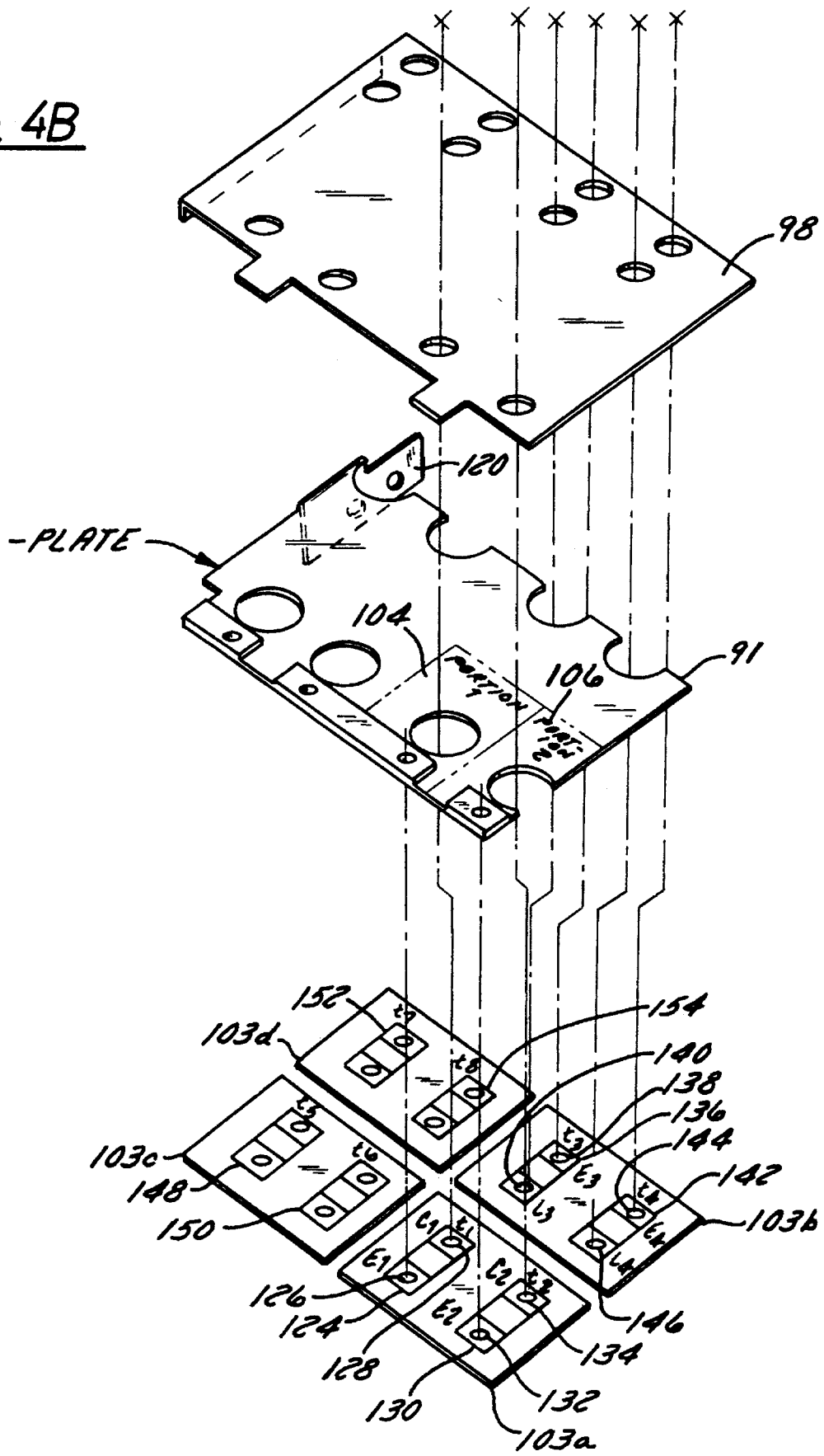

BUS BAR HAVING REDUCED PARASITIC INDUCTANCES AND EQUAL CURRENT PATH LENGTHS

BACKGROUND OF THE INVENTION

1. Field of the Invention

The present invention relates generally to bus bars. More particularly the present invention relates to bus bars having reduced parasitic inductances and equal current path lengths.

2. Background of the Related Art

Bus bars are commonly used in conjunction with high power converter and inverter circuits; the bus bar is the physical embodiment of the transistor interconnections in a converter or inverter circuit. One type of converter circuit converts DC power to AC power, a second type converts AC power to DC power. The discussion herein will focus on converters which convert DC power to AC power. Bus bars are often used in combination with each other in order to form a bus bar system, for example to increase power or to have a three phase system or both.

A typical DC to AC converter circuit 10 is illustrated in FIG. 1. The circuit 10 uses DC power from a positive input 28 and a negative input 26 to generate AC power at an output 30. The power from the output 30 is used to drive an AC device, such as an AC motor.

Looking first at the structure of the circuit 10, the circuit 10 comprises a first transistor 11 and a second transistor 12. First transistor 11 further includes a first collector 14 and a first emitter 16. Second transistor 12 further includes a second collector 18 and a second emitter 20.

The circuit also comprises lumped inductance 21 (represented as being located between the positive input 28 and the first collector 14) lumped inductance 22 (represented as being located between the first emitter 16, the second collector 18, and the output 30) and lumped inductance 23 (represented as being located between the negative input 26 and the second emitter 20). Lumped inductances 21, 22 and 23 are not discrete components in the circuit. Rather, they are spread throughout the circuit and represent the inductances caused by the transistors 11 and 12, the inputs 26 and 28, and the output 30, and the connections therebetween.

Turning now to the operation of circuit 10, the flow of current through the circuit will be described. When the first transistor 11 is turned on, current flows from the positive input 28, through the lumped inductance 21, into the first collector 14, through the first emitter 16, through the lumped inductance 22, and through the output 30.

Hereinafter, negative current will be described as positive current flowing in the opposite direction. For example, negative input 26 will be described as having positive current exiting it rather than as having negative current entering it. With this in mind, the flow of current through the second transistor will now be described: When the second transistor 12 is turned on, current flows from the output 30, through the lumped inductance 22, into the second collector 18, through the second emitter 20, through the lumped inductance 23, and through the negative input 26.

The transistors 11 and 12 are switched in such a way so as to produce an AC current at the output 30. (Typically, transistor 11 will be turned off while transistor 12 is turned on.) As is well known, there are a variety of ways to switch the transistors (e.g., by varying the timing of the switching) to produce an AC output. The particular method used will depend on the application.

FIG. 1 illustrates a first problem faced by high power converter circuits; namely, the problem of (lumped) parasitic inductances. Parasitic inductances are present in the components and connections of every circuit, and are undesirable because they decrease the efficiency of the circuit. Efficiency is decreased because there is a buildup of energy in the parasitic inductances when current is flowing through the circuit, and a subsequent dissipation into heat of this energy when the current is shut off. In a DC circuit, this phenomena is represented by the following relationship:

$$E = \frac{1}{2} \times L \times I^2 \tag{1}$$

where

E is the energy buildup in the inductor;

L is the parasitic inductance; and

I is the current flowing through the inductor.

When the current through a switching transistor is shut off (i.e., during commutation), the energy E built up in the inductor dissipates into heat energy, and is therefore wasted.

Another reason why parasitic inductances are undesirable is that they cause undesirable transients. This phenomenon is represented by the following relationship:

$$v = L \times \frac{di}{dt} \tag{2}$$

where v is the magnitude of the voltage transient;

L is the parasitic inductance;

di/dt is the change in current with respect to the change in time.

The transients occur as the transistors in the converter circuit are switched on and off (i.e., during commutation), causing sudden changes in the flow of current through the circuit. As is clear from equation (2), the size of the voltage transient is directly proportional to the size of the parasitic inductance.

Hence, equations (1) and (2) both illustrate the desirability of having low parasitic inductances in a converter circuit. Often, however, the parasitic inductances are quite large in a converter circuit. As is known, the magnitude of a parasitic inductance is related to the size and type of components in a circuit, and to the size and layout of the connections between the components in a circuit. In high power converter circuits, the components and connections are of increased size in order to handle the increased power. The result is an increase in the size of parasitic inductances. Therefore, in order to decrease power loss and voltage transients during commutation from one transistor to the other, it is desirable to provide a bus bar having reduced parasitic inductances.

The circuit 10 of FIG. 1 is of limited usefulness because singular transistors 11 and 12 are often not available at a rating high enough for the large currents that a particular application may demand. To increase the power rating (and therefore the current capacity) of a system, transistors will often be placed in parallel. A parallelled-transistor converter circuit 60 is illustrated in FIG. 2. As FIG. 2 illustrates, however, this configuration creates a second main problem faced by high power converter circuits; namely, the unequal current path lengths cause poor current sharing between the transistors.

We look first at the structure of the converter circuit 60 illustrated in FIG. 2. Circuit 60 comprises a first converter half 45 and a second converter half 58. First half 45 includes transistors 40, 42, and 44 which are in parallel with each other. Each of transistors 40, 42, and 44 are also in series with a resistor 46, 48, and 50, respectively. First half 45 is connected to a positive input 70 and an output 66. Second half 58 includes paralleled transistors 53, 55 and 57; each transistor being in series with a resistor 59, 61 and 63, respectively. Second half 58 is connected to a negative input 68 and the output 66.

We now consider the operation of circuit 60, and in particular consider two scenarios. In the first scenario, the resistors 46, 48, 50, 59, 61 and 63 are all set to zero. When transistors 40, 42, and 44 are turned on, current will enter at positive input 70, flow through the first half 45, and exit through the output 66.

It is important to note that current traveling through transistor 44 will travel a further distance than current traveling through transistor 40 (assuming that the way the circuit 60 is physically constructed bears relation to the way the schematic is drawn in FIG. 2). In other words, the current path lengths through the two transistors 40 and 44 are unequal.

A similar result is reached when current flows through second half 58. Hence, when transistors 53, 55 and 57 are turned on, current will enter at the output 66, flow through the second converter half 58, and exit through the negative input 68. Again, the current traveling through transistor 57 travels a further distance than the current traveling through transistor 53.

A shorter path through transistors 40 and 53 directly results in those paths having smaller impedances. Because of these smaller impedances (and the current sharing properties of impedances in parallel), more current will travel through transistors 40 and 53 than through transistors 44 and 57. This is undesirable because it causes transistors 40 and 53 to bear a disproportionate share of the load.

In the second operational scenario, resistors 46, 48, 50, 59, 61 and 63 all have non-zero values. The values of the resistors are calculated so as to force current sharing, i.e., by making the impedances of each of the current paths equal. For example, resistor 59 is somewhat larger than resistor 63 so that the respective impedances of the two paths are equal and therefore the current flowing through the two paths are equal. This is impractical, however, because it requires additional parts (thereby increasing the cost, complexity, and the amount of parasitic inductance in the circuit), and it requires careful matching between resistors 46, 48, 50, 59, 61, 63 and transistors 40, 42, 44, 53, 55 and 57.

FIG. 3 illustrates another effort to deal with the current sharing problem. In FIG. 3, a circuit 72 is comprised of transistors 74, 76, 78, 80, 82 and 84, which are arranged in a circle power in/out configuration. The collectors of the transistors are connected to a ring or can 88 and to each other at node 86. The current through each of the transistors 74, 76, 78, 80, 82 and 84 are equal since each of the respective "radii" are equal.

However, this configuration suffers the disadvantage that it is impractical and difficult to build. One reason the circle power in/out configuration is difficult to build is that high power transistors are physically larger than low power transistors. This makes them more awkward to work with, especially where the circuit layout is itself awkward.

A second reason the configuration is difficult to build is that converter circuits should be constructed so that the transistors operate at the same temperature. The benefit of having equal current path lengths (i.e., equal current sharing) in circuit 72 will be lost if the transistors are not operating at the same temperature. When the devices are operating at the same temperature, any dependence of impedance on temperature cancels out and the current sharing between the devices is not upset. On the other hand, when the devices are not operating at the same temperature, the dependence of impedance on temperature will cause some current paths to have different impedances and will cause current sharing problems. Hence, in all converter circuits, equal current sharing is promoted both by having equal current path lengths and by having the transistors operate at the same temperature. In the converter circuit 72 of FIG. 3, it is more difficult than usual to get the transistors to operate at the same temperature because of the circuit's awkward layout.

SUMMARY OF THE INVENTION

A bus bar having equal current path lengths and reduced parasitic inductances is presented. A bus bar of the present invention has a first plate connected to a collector of a first transistor, a collector of a second transistor, an emitter of a third transistor and an emitter of a fourth transistor; a second plate including a second plate input connected to a collector of the third transistor and a collector of the fourth transistor; a third plate including a third plate input connected to an emitter of the first transistor and an emitter of the second transistor; and a fourth plate which is connected to the first plate. The first plate, the second plate, and the third plate are disposed and arranged such that the lengths of the current paths from the fourth plate through the first transistor to the third plate, from the fourth plate through the second transistor to the third plate, from the fourth plate through the third transistor to the second plate, and from the fourth plate through the fourth transistor to the second plate are all equal.

A bus bar of the present invention has several advantages. First, the bus bar is designed to reduce parasitic inductances. The present invention utilizes flat, wide bus bar plates and stacks them as closely together as possible to reduce parasitic inductances. This has the beneficial effect of increasing circuit efficiency and reducing voltage transients.

A second advantage of the present invention is that it has equal current path lengths. This is accomplished by the manner in which the first, second, third and fourth plates are disposed and arranged. This has the beneficial effect of promoting equal current sharing among transistors.

A third advantage of the present invention is that it makes it easy to keep the transistors operating at the same temperature. The layout of the present invention is simple, allowing parallelled transistors to be placed at the same distance along a common heat sink. This too has the beneficial effect of promoting equal current sharing among transistors.

A fourth advantage of the present invention is that it is easy to fabricate. The present invention has a simple layout and does not utilize additional resistors for the purpose of making current paths equal, and therefore does not require careful matching between transistors and their respective resistors.

A fifth advantage of the present invention is that the two inputs and one output are all located on the same side of the structure. This makes it easier to integrate the present invention into a bus bar system.

Other objects, features, and advantages of the present invention will become apparent to those skilled in the art from the following detailed description and accompanying drawings. It should be understood, however, that the detailed description and specific examples, while indicating preferred embodiments of the present invention, are given by way of illustration and not of limitation. Many changes and modifications within the scope of the present invention may

BRIEF DESCRIPTION OF THE DRAWINGS

FIGS. 4A and 4B illustrate the structure of a converter bus bar of the present invention;

DETAILED DESCRIPTION OF A PREFERRED EMBODIMENT

Figure 1:
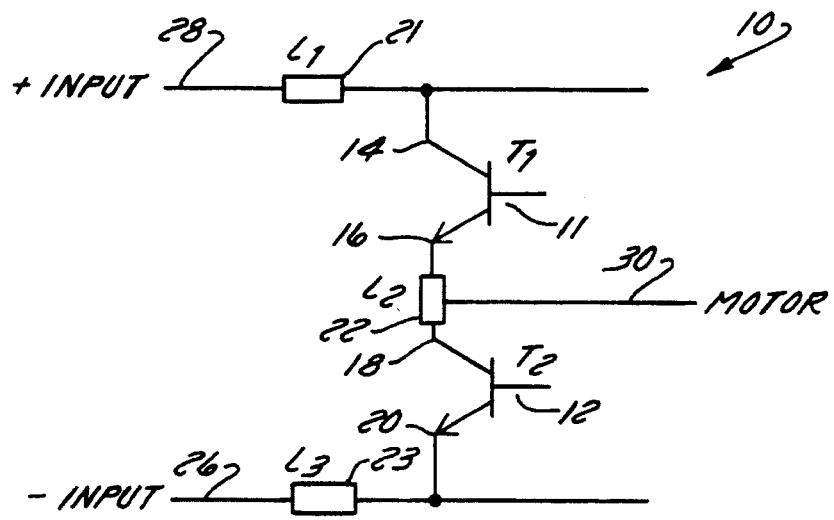
FIG. 1 is a schematic representation of a prior art DC to AC converter wherein parasitic inductances are present.
Figure 2:
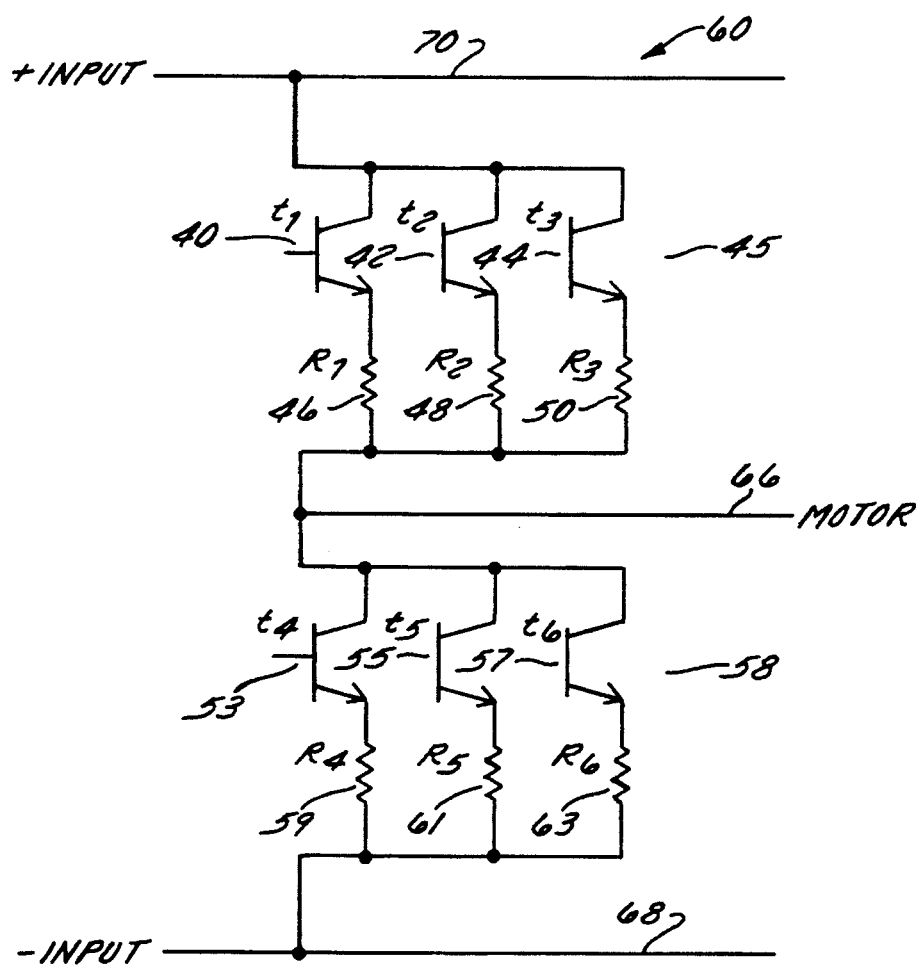
FIG. 2 is a schematic representation of a prior art DC to AC converter wherein a plurality of transistors have unequal current path lengths.
Figure 3:
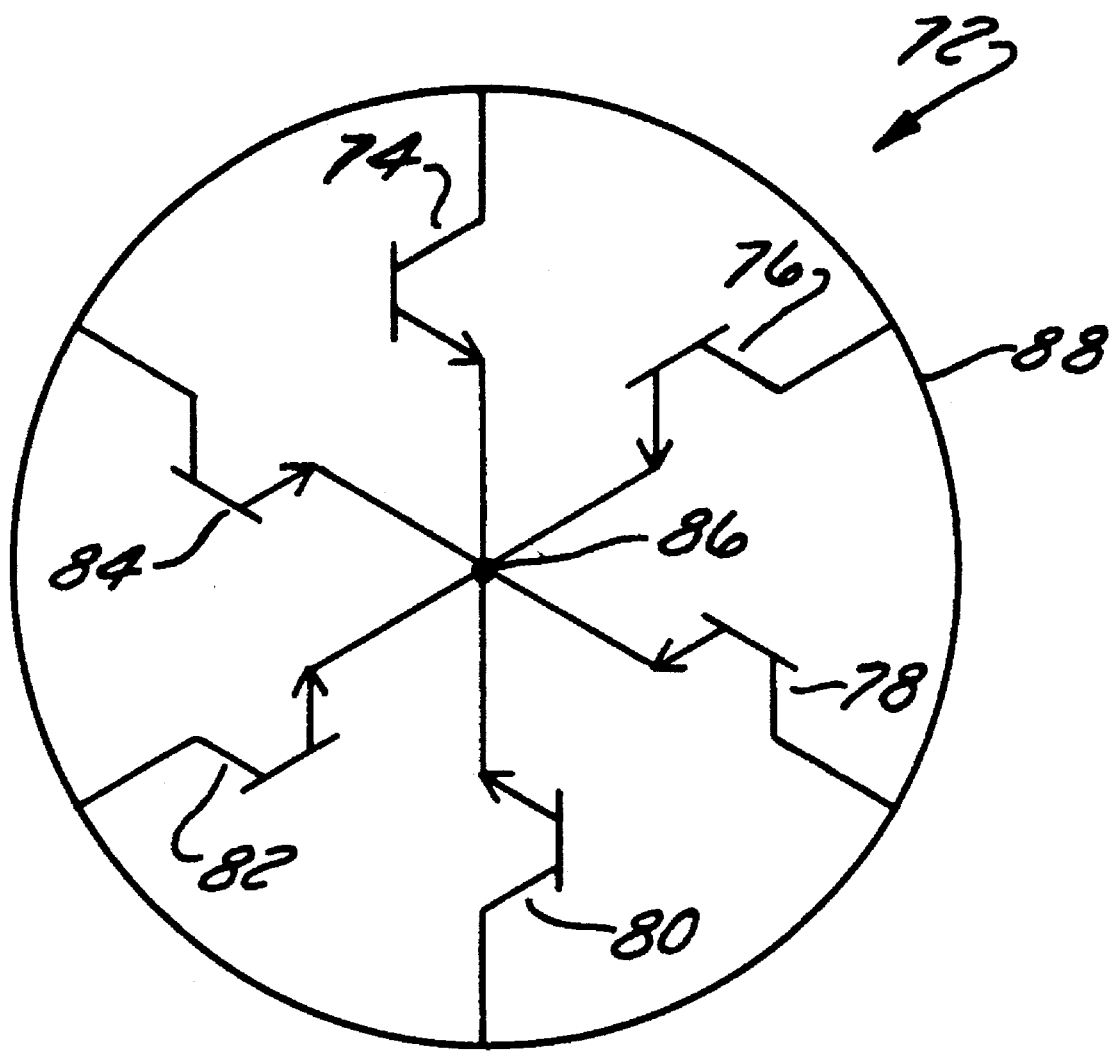
FIG. 3 is a schematic representation of a prior art DC to AC converter wherein a circle power in/out configuration is utilized in order to deal with the problem of unequal current path lengths.
Figure 4A:
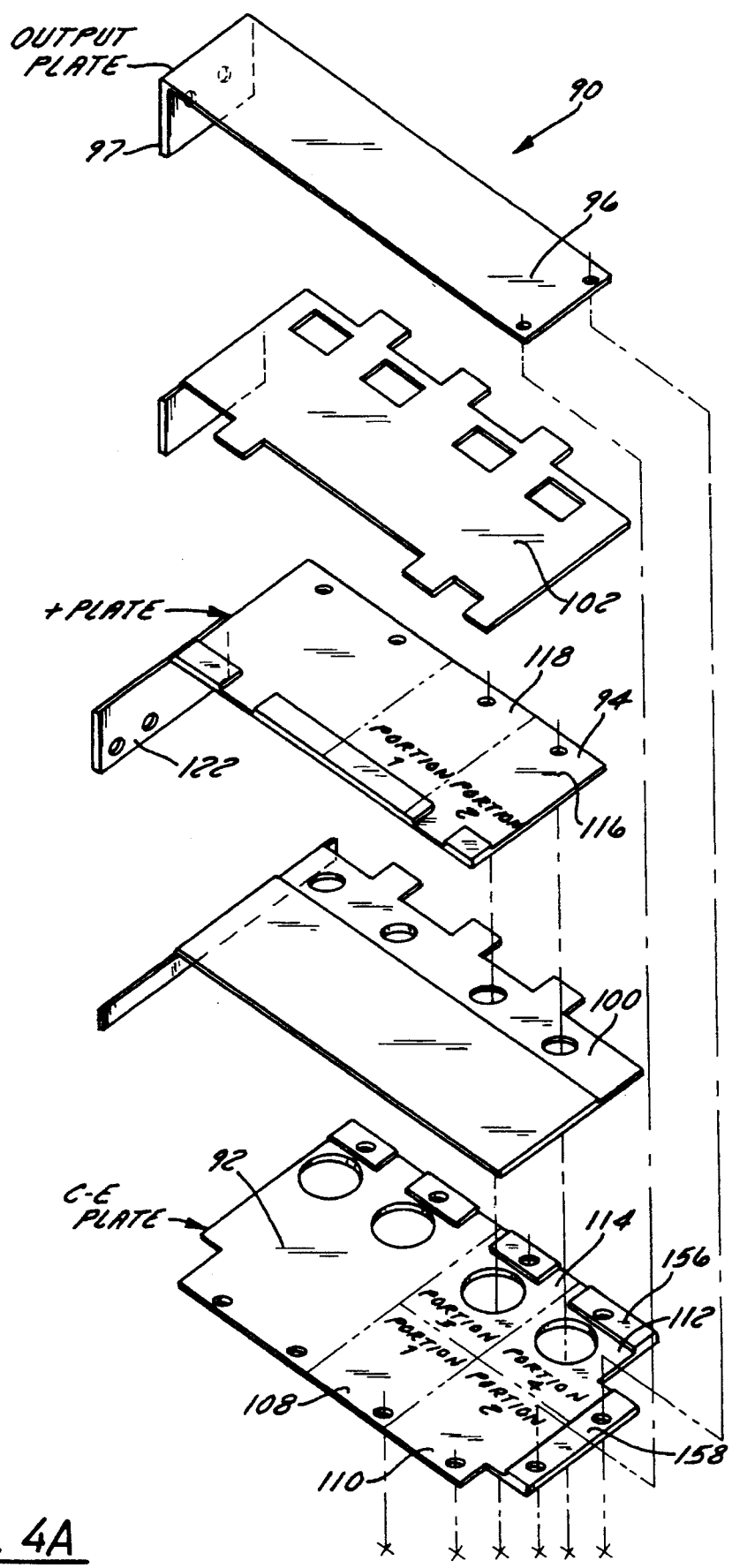
Figure 5A:
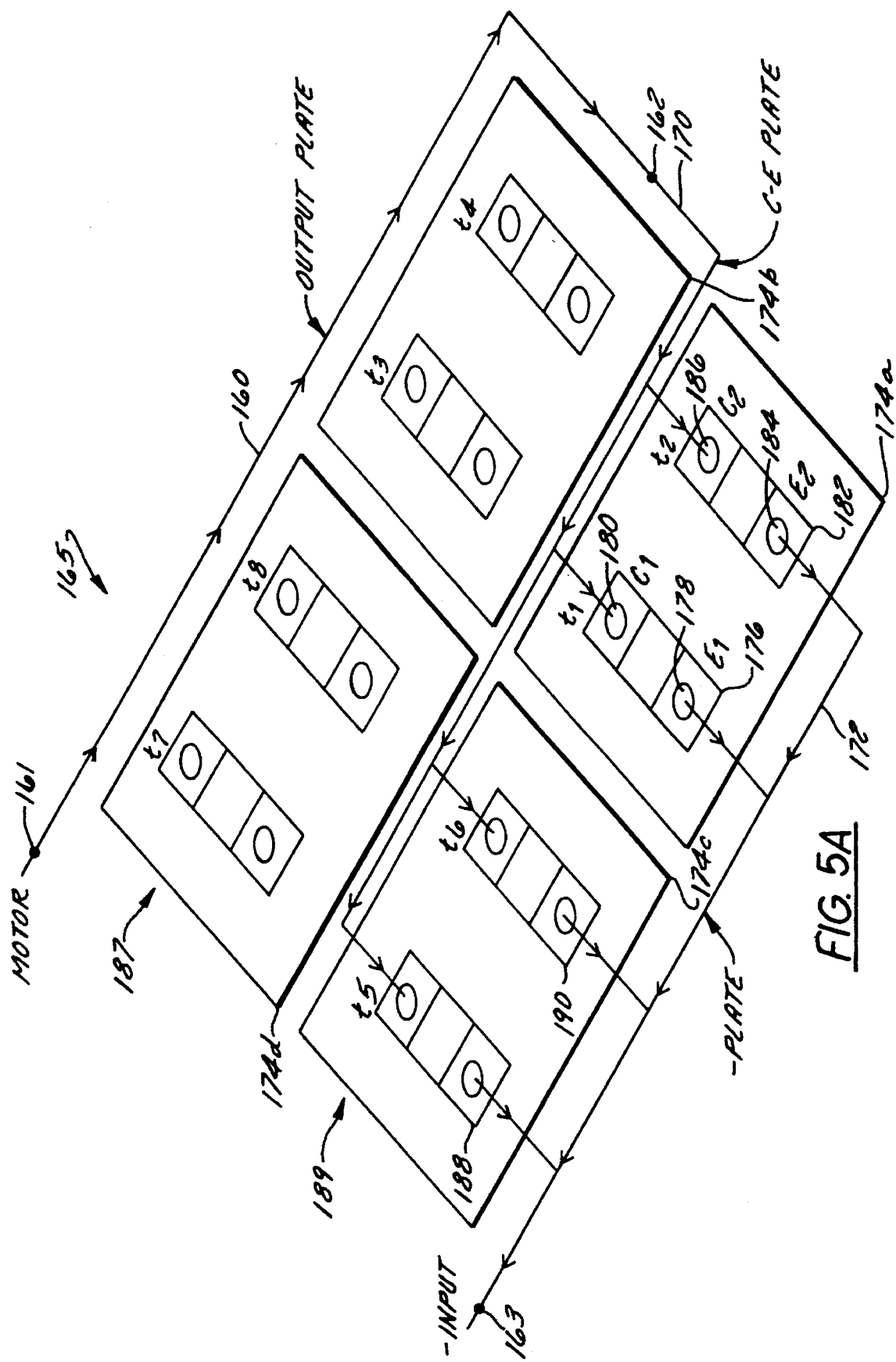
FIGS. 5A and 5B illustrate the operation of a bus bar of the present invention.
Figure 5B:
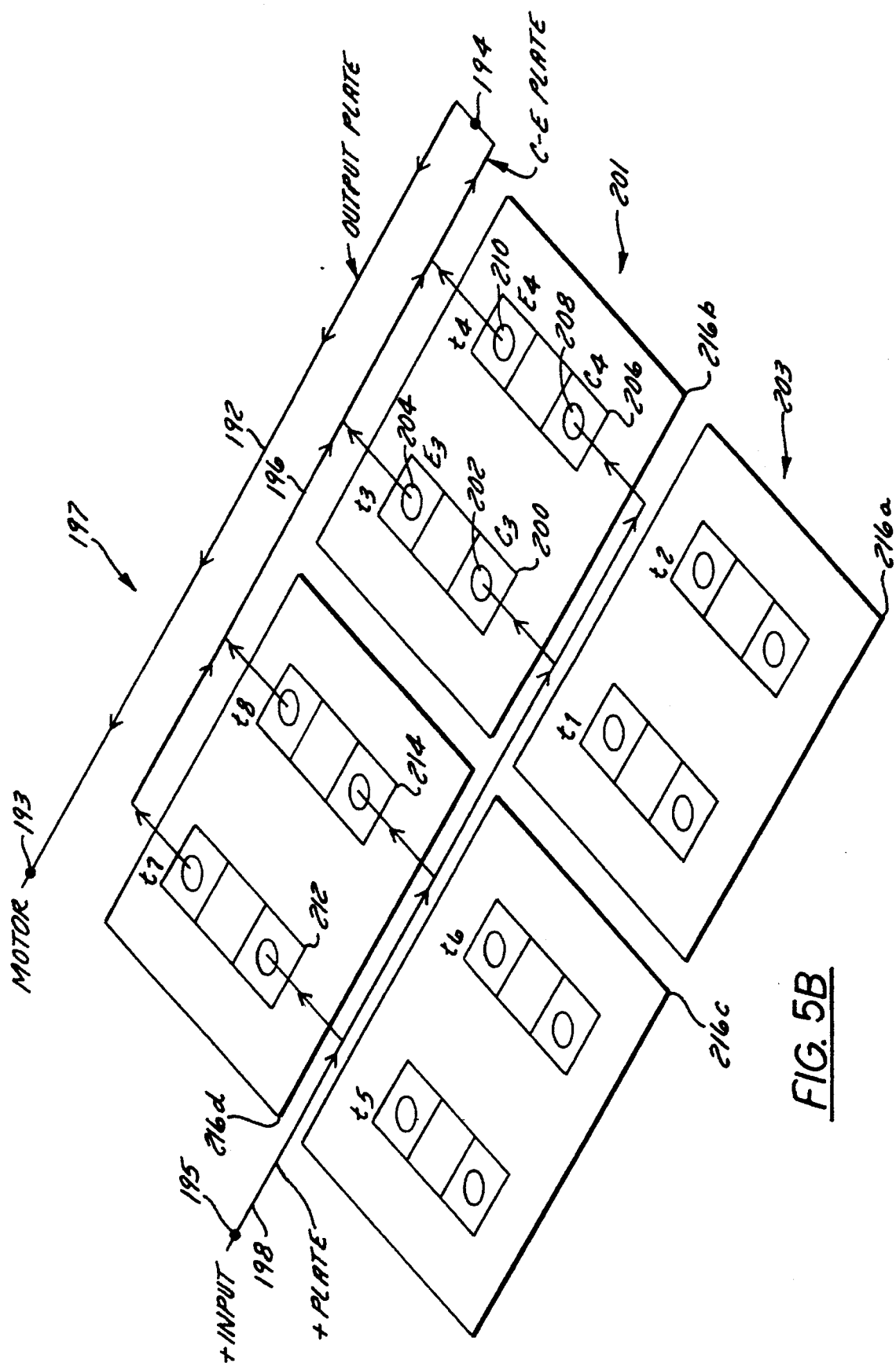

Referring now to FIGS. 4A, 4B, 5A, and 5B, a bus bar of the present invention is illustrated. FIGS. 4A and 4B are particularly helpful for understanding the structure of the present invention; FIGS. 5A and 5B are particularly helpful for understanding the operation of the present invention.

As illustrated in FIGS. 4A and 4B, a bus bar 90 of the present invention comprises a first plate such as C-E plate 92, a second plate such as positive plate 94, a third plate such as negative plate 91, and a fourth plate such as output plate 96. Preferably, the plates 91, 92, 94 and 96 are insulated and made out of copper.

Positive plate 94 comprises a second plate input such as positive plate input 122, whereas negative plate 91 also comprises a third plate input such as negative plate input 120. Hence, positive plate input 122 and negative plate input 120 form the DC power inputs of the bus bar 90, and will typically be connected to the positive and negative rails of a DC bus, respectively. Further, output plate 96 comprises an output connection 97, which forms the output of the bus bar. Output connection 97 will typically be connected to an AC load, such as an AC motor. The output plate is also connected to the C-E plate 92 at interconnection 158, which is further connected to the positive plate 94 and negative plate 91 via transistors, as described below.

The bus bar 90 comprises transistor modules 103a and 103b. Transistor modules 103a and 103b are manufactured such that each module comprises two transistors. Transistor module 103a is comprised of a first transistor 124 and a second transistor 130; and transistor module 103b is comprised of a third transistor 136 and a fourth transistor 142. The present invention is not limited to a structure having four transistors. In a preferred embodiment, the bus bar 90 further comprises a transistor module 103c (including a fifth transistor 148 and a sixth transistor 150) and a transistor module 103d (including a seventh transistor 152 and an eighth transistor 154) for a total of eight transistors.

The first transistor 124 has an emitter 126 which is connected to a first portion 104 of the negative plate 91 and a collector 128 which is connected to a first portion 108 of the C-E plate 92. Similarly, the second transistor 130 has an emitter 132 which is connected to a second portion 106 of the negative plate 91 and a collector 134 which is connected to a second portion 110 of the C-E plate 92. In a preferred embodiment, the fifth transistor 148 and the sixth transistor 150 are connected to the C-E plate 92 and the negative plate 91 in a manner similar to the first transistor 124 and the second transistor 130.

Third transistor 136 has an emitter 138 which is connected to a third portion 114 of C-E plate 92 and a collector 140 which is connected to a first portion 118 of positive plate 94. Similarly, the fourth transistor 142 has an emitter 144 which is connected to a fourth portion 112 of the C-E plate 92 and a collector 146 which is connected to a second portion 116 of the positive plate 94. In a preferred embodiment, the seventh transistor 152 and the eighth transistor 154 are connected to the C-E plate 92 and the positive plate 94 in a manner similar to the third transistor 136 and the fourth transistor 142.

In a preferred embodiment, the bus bar 90 also comprises laminate 98 (located between the negative plate 91 and the C-E plate 92), laminate 100 (located between the C-E plate 92 and the positive plate 94), and laminate 102 (located between the positive plate 94 and the output plate 96). The laminates 98, 100 and 102 should be as thin as possible, allowing plates 91, 92, 94 and 96 to be spaced as closely together as possible to reduce parasitic inductance. However, if the laminates are too thin, the plates will short circuit. In a preferred embodiment, these laminates are made out of Nomex™ brand or Kapton™ brand polyamide insulative materials, which are both commercially available for such purposes.

Several advantages of the present invention are particularly well illustrated in FIGS. 4A and 4B. First, the manner in which the present invention achieves reduced parasitic inductances is illustrated. Generally, the inductances are minimized first through the use of wide, thin plates and second through the use of cancellation effects.

First, as is well known, the inductance of a wide, thin plate-type conductor is generally much lower than the inductance of a cylindrical, wire-type conductor. The flow of current through a wire-type conductor will create a magnetic field which encircles the wire. Because there is no cancellation of magnetic forces, a wire is ideally adapted for creating an inductor. On the other hand, a wide, thin plate is less well adapted for creating an inductor. A plate can be thought of as a series of infinitely thin wires spaced infinitely close together. In this case the magnetic field which encircles each of the infinitely thin wires cancel. Theoretically, if the plate was infinitely wide and infinitely thin (i.e., if the surface across which the current traveled was wide but not deep), the magnetic fields would cancel completely and the inductance of the plate would be zero.

As a matter of practicality, it is impossible to completely eliminate parasitic inductance due to other design considerations and limitations. Nevertheless, the use of wide, thin plates can be used to significantly reduce parasitic inductance. Hence, to the extent possible, a preferred embodiment of the bus bar of the present invention utilizes wide, thin plates for making electrical connections in the bus bar.

The ability to use wide, thin plates, however, is limited by other design considerations and limitations. For example, the plates must be thick enough to carry the amount of current that the bus bar is design to deliver. Also, the width of the plates will generally be limited to the width of the transistor modules.

The second way in which parasitic inductance is reduced is through cancellation of magnetic fields. Hence, the purpose of laminates 98, 100, and 102 is to minimize parasitic inductance by allowing minimal spacing between plates 91, 92, 94 and 96. Minimal spacing between the plates 91, 92, 94 and 96 promotes the cancellation of parasitic inductance between each of those plates. Cancellation in this way is maximized if the C–E 92 plate is placed in between the input plates 91 and 94, as illustrated, although other arrangements are possible.

A second advantage illustrated in FIGS. 4A and 4B is that the present invention is easy to fabricate. The present invention has a simple layout and does not utilize additional resistors for the purpose of balancing the current between the transistors, and therefore does not require careful matching between transistors and their respective resistors.

A third advantage illustrated in FIGS. 4A and 4B is that with the present invention the two inputs and one output may all be located on the same side of the structure. This makes it easier to integrate the present invention into a bus bar system, as further illustrated below in FIG. 6.

FIG. 5A and 5B are schematic representations of the bus bar 90 illustrated in FIG. 4A and 4B, further illustrating current flow through the transistors. In FIG. 5A, a bus bar 165 having a first half 187 and a second half 189 is illustrated. First half 187 comprises a transistor module 174b, and in a preferred embodiment, a transistor module 174d. Second half 189 comprises a transistor module 174a (including a first transistor 176 and a second transistor 182) and, in a preferred embodiment, a transistor module 174c (including a fifth transistor 188 and a sixth transistor 190).

FIG. 5A illustrates current flowing through the second half 189. Positive current enters at a fourth plate output such as output connection 161. (Equivalently, negative current exits output connection 161.) The current then travels along a fourth plate such as output plate 160 until it reaches interconnection 162. The current then enters a first plate such as C–E plate 170. From C–E plate 170, the current enters transistor module 174a, and more particularly, a first transistor 176 and a second transistor 182. The current enters a first collector 180 of the first transistor 176 and then exits a first emitter 178 of the first transistor 176 into a third plate such as negative plate 172. The current also enters a second collector 186 of the second transistor 182 and exits a second emitter 184 of the second transistor 182 into the negative plate 172. In a preferred embodiment, the bus bar 165 comprises eight transistors, and current also travels through the fifth transistor 188 and the sixth transistor 190. The positive current then exits through a third plate input such as negative plate input 163. (Equivalently, negative current enters through input 163.)

By comparing FIG. 5A with FIGS. 4A and 4B, it is apparent that the negative plate 172, and the C–E plate 170 are disposed and arranged such that the length of the current path from the negative plate 172 through each of the respective transistors to the output plate 160 is equal. In the embodiment shown in FIG. 5A, this is because all current must flow through interconnection 162 (interconnection 158 in FIG. 4A) before entering any of the transistors. Interconnection 162 is the furthest point from input 163 and output 161, and all current flows through interconnection 162. Essentially, all current must flow all the way down to the interconnection 162, and then all the way back. There are no "short cuts"; there are no current paths having shorter current path lengths.

Note that the output plate 160 need not be disposed and arranged as illustrated. Rather, any arrangement of the output plate 160 will suffice so as all current must flow through the output plate 160.

Referring now to FIG. 5B, a bus bar 197 having a first half 201 and a second half 203 is illustrated. First half 201 comprises a transistor module 216b (including a third transistor 200 and a fourth transistor 206) and, in a preferred embodiment, a transistor module 216d (including a seventh transistor 212 and an eighth transistor 214). Second half 203 comprises transistors module 216a and, in a preferred embodiment, transistor module 216c.

Positive current enters at a second plate input such as positive plate input 195. The current then travels along a second plate such as positive plate 198. Current enters a third collector 202 of the third transistor 200 and it exits a third emitter 204 of the third transistor 200 into a first plate such as C–E plate 196. Current also enters a fourth collector 208 of the fourth transistor 206 and exits a fourth emitter 210 of the fourth transistor 206 into C–E plate 196. In a preferred embodiment, current also flows through the seventh transistor 212 and the eighth transistor 214 into the C–E plate 196. Current will then flow to interconnection point 194, whereafter it will enter a fourth plate such as output plate 192. Current will then flow out a fourth plate output such as output plate 193 to an AC load.

By comparing FIG. 5B with FIGS. 4A and 4B, it is apparent that the positive plate 198, and the C–E plate 196 are disposed and arranged such that the length of the current path from the positive plate 198 through each of the respective transistors to the output plate 192 is equal. The reason is the same as before. In the embodiment shown in FIG. 5B, all current must flow through interconnection 194 (interconnection 158 in FIG. 4A) before entering any of the transistors. Interconnection 194 is the furthest point from input 195 and output 193, and all current flows through interconnection 194. Essentially, all current must flow all the way down to the interconnection 194, and then all the way back.

FIGS. 4A, 4B, 5A and 5B therefore illustrate a further advantage of the present invention. In particular, the positive plate, the negative plate, the C–E plate, and the output plate are disposed and arranged such that the length of the current path from either the positive plate or the negative plate (depending on which half of the circuit is conducting current) through each of the transistors to the output plate is equal.

Figure 6:
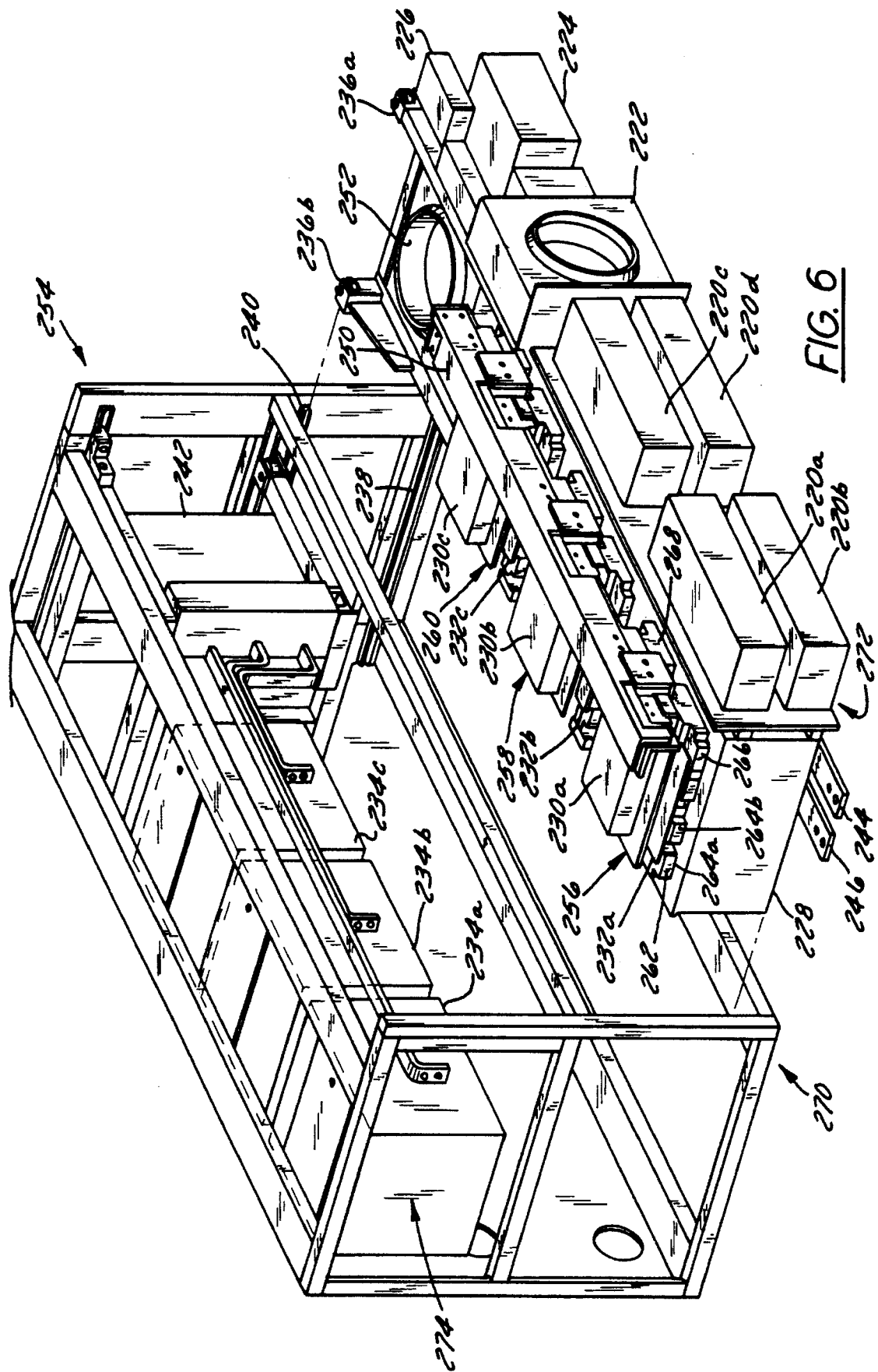
FIG. 6 illustrates the integration of a bus bar of the present invention into a larger system.

Referring now to FIG. 6, the integration of a bus bar of the present invention into a larger system is illustrated. System 254 comprises a frame 270, a capacitor bank 274, and an inverter 272.

Frame 270 serves as a mounting for inverter 272 and capacitor bank 274. Inverter 272 is fitted with a plurality of rollers including rollers 236a and 236b. Frame 270 includes a plurality of tracks such as tracks 238 and 240 which are receptive to these rollers. The tracks of frame 270 and the rollers of inverter 272 facilitate mounting inverter 272 within frame 270. A similar arrangement is present for the capacitor bank 274.

Capacitor bank 274 further includes capacitor sub-banks 234a, 234b and 234c. Capacitor sub-banks 234a, 234b, and 234c are DC bus capacitors and are connected to a positive bar 246 and a negative bar 244. A plurality of capacitor sub-banks is used to provide redundancy to prevent losing the entire bank 274 if there is a fault.

Inverter 272 comprises three bus bars 256, 258 and 260. Bus bar 256 comprises transistor module 262 which further includes transistors 264a and 264b. Bus bar 256 also comprises transistor modules 266 and 268, and a fourth module which is not visible. Bus bars 258 and 260 are similarly built. Inverter 272 also comprises the positive bar 246 and the negative bar 244 which are connected to positive plate inputs and negative plate inputs, respectively, of bus bars 256, 258, and 260. The center connection is made through interconnection bar 250.

Bus bars 256, 258 and 260 each have an interface card 232a, 232b, 232c, respectively, to control transistor switching. Additionally, bus bars 256, 258 and 260 each have a snubber circuit 230a, 230b and 230c, respectively, for controlling transients. Also, inverter 272 includes a capacitor pre-charge circuit 226 and current limiting resistors 224.

To facilitate cooling, inverter 272 comprises vents 220a, 220b, 220c and 220d, and vent 228. To generate an airflow through these vents inverter 272 further comprises fans 222 and 252. Fan 252 mainly operates to cool the transistors, and fan 222 mainly operates to cool the converter. Note that the transistors which are in parallel (e.g., the transistors of modules 262 and 266) are all at the same distance along a common heat sink, so they are all the same temperature.

Hence, FIG. 6 illustrates an additional advantage of the present invention. In particular, the present invention is able to keep the transistors operating at the same temperature. The layout of the present invention is simple, allowing parallelled transistors to be placed at the same distance along a common heat sink. For example, transistors 264a and 264b are equidistant from the cooling fan 222. This has the beneficial effect of promoting equal current sharing among transistors by keeping the parallelled transistors at equal temperatures.

It is to be understood that the embodiments of the present invention not disclosed herein are fully intended to be within the scope of the appended claims.

I claim:

1. A bus bar comprising:
   a first plate connected to a collector of a first transistor, a collector of a second transistor, an emitter of a third transistor and an emitter of a fourth transistor;
   a second plate including a second plate input connected to a collector of said third transistor and a collector of said fourth transistor;
   a third plate including a third plate input connected to an emitter of said first transistor and an emitter of said second transistor; and
   a fourth plate which is connected to said first plate;
   wherein said first plate, said second plate, and said third plate are disposed and arranged such that the lengths of the current paths
      from said fourth plate through said first transistor to said input of said third plate,
      from said fourth plate through said second transistor to said input of said third plate,
      from said fourth plate through said third transistor to said input of said second plate, and
      from said fourth plate through said fourth transistor to said input of said second plate
   are all equal.

2. A bus bar as in claim 1, further comprising a laminate, said laminate being generally disposed between said fourth plate and one of said first plate, said second plate, and said third plate.

3. A bus bar as in claim 2, further comprising a second laminate, said second laminate being generally disposed between said third plate and one of said first plate, said second plate, and said fourth plate.

4. A bus bar as in claim 3, further comprising a third laminate, said third laminate being generally disposed between said second plate and one of said first plate, said third plate, and said fourth plate.

5. A bus bar as in claim 1, further including
   a fifth transistor and sixth transistor, said fifth and sixth transistor each having an emitter connected to said third plate and a collector connected to said first plate; and
   a seventh transistor and an eighth transistor, said seventh transistor and eighth transistor each having a collector connected to said second plate and an emitter connected to said first plate.

6. A bus bar as in claim 1, wherein said first plate is disposed in between said second plate and said third plate.

7. A bus bar as in claim 1, further including a cooling fan, wherein said first transistor and said second transistor are generally equidistant from said cooling fan, and wherein said third transistor and said fourth transistor are generally equidistant from said cooling fan.

8. A bus bar, said bus bar comprising:
   a collector-emitter plate, said collector-emitter plate including
      a first collector-emitter plate portion,
      a second collector-emitter plate portion,
      a third collector-emitter plate portion, and
      a fourth collector-emitter plate portion;
   a positive plate, said positive plate including
      a first positive plate portion, and
      a second positive plate portion;
   a negative plate, said negative plate including
      a first negative plate portion, and
      a second negative plate portion;
   a first transistor, said first transistor including
      a first collector, said first collector being connected to said first collector-emitter plate portion, and
      a first emitter, said first emitter being connected to said first negative plate portion;
   a second transistor, said second transistor including
      a second collector, said second collector being connected to said second collector-emitter plate portion, and
      a second emitter, said second emitter being connected to said second negative plate portion;
   a third transistor, said third transistor including
      a third collector, said third collector being connected to said first positive plate portion, and
      a third emitter, said third emitter being connected to said third collector-emitter plate portion; and
   a fourth transistor, said fourth transistor including
      a fourth collector, said fourth collector being connected to said second positive plate portion, and
      a fourth emitter, said fourth emitter being connected to said fourth collector-emitter plate portion.

9. The bus bar as in claim 8, said bus bar further comprising an output plate, said output plate being connected to said collector-emitter plate.

10. The bus bar as in claim 8, wherein said positive plate further includes a positive plate input, said negative plate further includes a negative plate input, and wherein there is a current flow through each of said transistors, said current flow through each of said transistors having a path length, said path length being defined by the distance from one of said negative plate input and said positive plate input to said output plate, said current flow path lengths through each of said transistors being equal.

11. A bus bar system comprising:
   a capacitor bank;
   an inverter, said inverter including a plurality of bus bars, each of said bus bars further including a first plate connected to a collector of a first transistor, a collector of a second transistor, an emitter of a third transistor and an emitter of a fourth transistor, a second plate including a second plate input connected to a collector of said third transistor and a collector of said fourth transistor, a third plate including a third plate input connected to an emitter of said first transistor and an emitter of said second transistor, and a fourth plate which is connected to said first plate, wherein said first plate, said second plate, and said third plate are disposed and arranged such that the lengths of the current paths from said fourth plate through said first transistor to said input of said third plate, from said fourth plate through said second transistor to said input of said third plate, from said fourth plate through said third transistor to said input of said second plate, and from said fourth plate through said fourth transistor to said input of said second plate are all equal; and a frame, said frame being receptive to said capacitor bank and said inverter such that said capacitor bank and said inverter are closely juxtaposed in said frame.

12. A bus bar system as in claim 11, further including a plurality of interface cards, said interface cards controlling switching of each of said transistors.

* * * * *